US009596793B2

(12) United States Patent
Jung et al.

(10) Patent No.: US 9,596,793 B2
(45) Date of Patent: Mar. 14, 2017

(54) RADIO FREQUENCY SHIELD WITH PARTITIONED ENCLOSURE

(71) Applicant: General Instrument Corporation, Horsham, PA (US)

(72) Inventors: Thomas A. Jung, San Diego, CA (US); Shr-Min Chen, Taipei (TW); Yung Chun Lu, Taipei (TW); Wayne C. Weeks, San Diego, CA (US)

(73) Assignee: ARRIS Enterprises, Inc., Suwanee, GA (US)

( * ) Notice: Subject to any disclaimer, the term of this patent is extended or adjusted under 35 U.S.C. 154(b) by 109 days.

(21) Appl. No.: 13/864,273

(22) Filed: Apr. 17, 2013

(65) Prior Publication Data

US 2014/0313677 A1   Oct. 23, 2014

(51) Int. Cl.
*H05K 9/00* (2006.01)
*H01R 13/6594* (2011.01)
*H01R 24/50* (2011.01)

(52) U.S. Cl.
CPC ....... *H05K 9/0052* (2013.01); *H01R 13/6594* (2013.01); *H01R 24/50* (2013.01)

(58) Field of Classification Search
CPC .................................................. H01R 13/6594
USPC .................................... 361/816, 814; 439/63
See application file for complete search history.

(56) References Cited

U.S. PATENT DOCUMENTS

| 4,325,103 | A | * | 4/1982 | Ito | H05K 9/006 |
| | | | | | 174/351 |
| 4,661,888 | A | | 4/1987 | Jewell et al. | |
| 5,438,690 | A | | 8/1995 | Tsukuda | |
| 5,710,999 | A | * | 1/1998 | Iwase et al. | 455/349 |
| 6,072,981 | A | * | 6/2000 | Inoue | 725/149 |
| 7,466,564 | B2 | * | 12/2008 | Harada et al. | 361/814 |
| 8,059,416 | B2 | * | 11/2011 | Li et al. | 361/752 |
| 8,259,457 | B2 | | 9/2012 | Mills | |
| 2001/0048593 | A1 | * | 12/2001 | Yamauchi et al. | 361/807 |
| 2003/0128535 | A1 | * | 7/2003 | Otani | H05K 9/0016 |
| | | | | | 361/816 |
| 2003/0174487 | A1 | * | 9/2003 | Garmong | 361/816 |
| 2005/0208831 | A1 | * | 9/2005 | Lee | 439/608 |
| 2007/0280603 | A1 | * | 12/2007 | Sakata et al. | 385/88 |

(Continued)

FOREIGN PATENT DOCUMENTS

| EP | 1246517 A2 | 10/2002 |
| GB | 2274949 A | 8/1994 |
| JP | 2003-309478 A | 10/2003 |

OTHER PUBLICATIONS

PCT Search Report & Written Opinion, Re: Application #PCT/US2014/033609; dated Jul. 14, 2014.

(Continued)

*Primary Examiner* — Courtney Smith
*Assistant Examiner* — Jessey R Ervin
(74) *Attorney, Agent, or Firm* — Stewart M. Wiener

(57) ABSTRACT

A radio frequency (RF) shield includes a shield enclosure formed of conductive material that defines and partially encloses an interior cavity. The shield enclosure is configured to receive, within the interior cavity, a shielding partition securable in a fixed position that defines one end of a first chamber within a narrow portion of the shield enclosure. The first chamber provides RF isolation of an RF conductor that is enclosed within the first chamber.

17 Claims, 5 Drawing Sheets

(56) References Cited

U.S. PATENT DOCUMENTS

2011/0021042 A1* 1/2011 Weidner .......... H01R 13/65802
                                                    439/63
2011/0299262 A1* 12/2011 Crotty ................ H01R 13/6271
                                                    361/818
2012/0174179 A1   7/2012 Kwon

OTHER PUBLICATIONS

Examination Report, Re: Great Britain Application No. GB1519305.5, dated Jan. 12, 2016.
Examination Report, Re: Great Britain Application No. GB1519305.5, dated Sep. 30, 2016.
Examination Report, Re: European Application No. 14723641.8, dated Sep. 30, 2016.

* cited by examiner

RADIO FREQUENCY SHIELD WITH PARTITIONED ENCLOSURE

BACKGROUND

Electronic devices, especially consumer equipment such as modems and gateways, have generally faced conflicting requirements (which may be imposed, for example, by market forces, cost constraints, or regulatory requirements). These conflicting requirements have included, for example, increased requirements for radiated immunity performance relative to older products, while being required to fit into a smaller design envelope.

BRIEF DESCRIPTION OF THE DRAWINGS

Various features of the embodiments described in the following detailed description can be more fully appreciated when considered with reference to the accompanying figures, wherein the same numbers refer to the same elements.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures have not been described in detail so as not to unnecessarily obscure the embodiments.

Aspects of the present invention are able to provide, in a radio frequency (RF) shield with an exterior enclosure portion formed in one piece, an RF immunity of at least 10 volts per meter (V/m). In conventional RF shields used for coaxial cable connectors, a radiated immunity of 10 V/m is considered a high performance level, which many conventional RF shields are unable to meet.

An illustrative embodiment provides a high performance RF shielded enclosure (e.g., a configuration that will meet at least an RF immunity performance standard of 10 V/m), using a "bottleneck" design which allows for minimization or reduction of the I/O area, resulting in a smaller product. In an embodiment, the shape of the RF shielded enclosure facilitates compliance with the RF immunity requirement while minimizing size. In an illustrative embodiment, the size and/or shape of the enclosure are optimized for performance and cost, e.g., electromagnetic interference (EMI) shielding performance enhancement and product size reduction.

Figure 1:
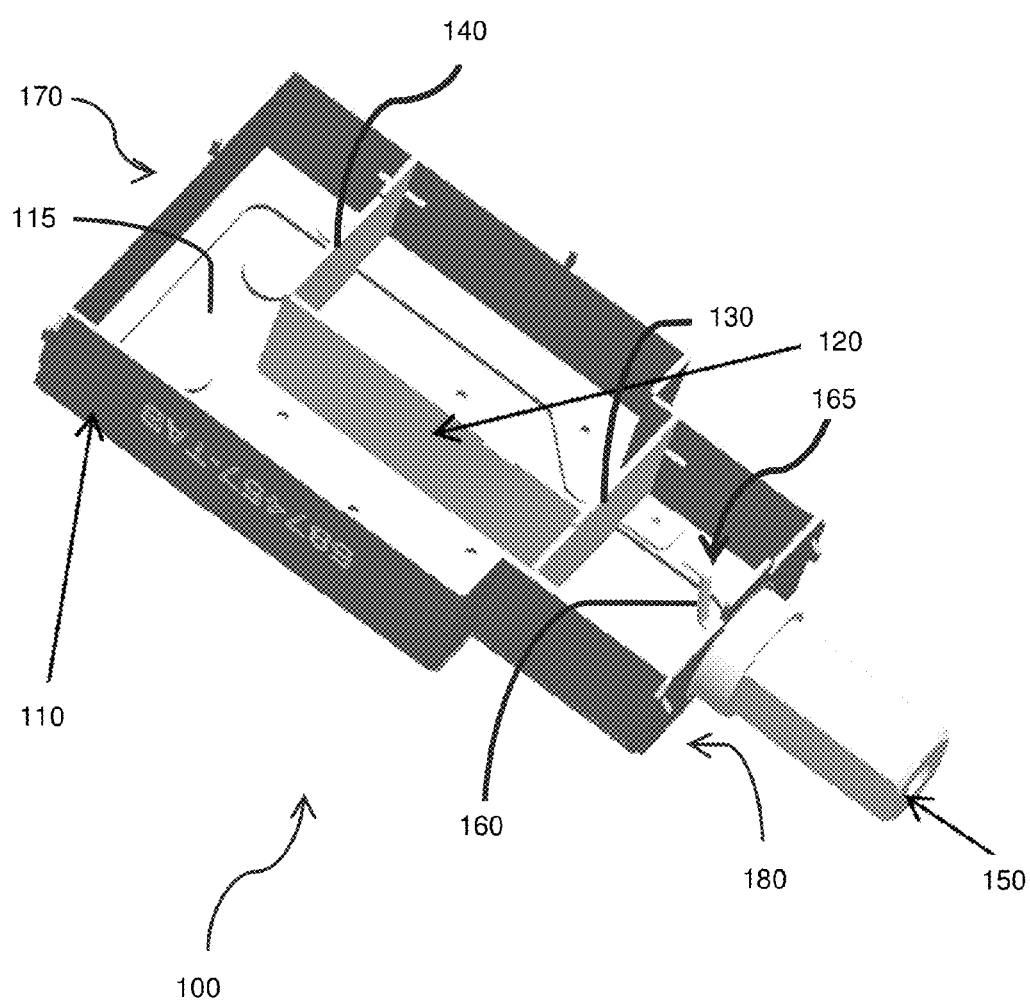
FIG. 1 depicts a perspective view of a radio frequency (RF) shield, according to an embodiment.

FIG. 1 is a perspective view of a radio frequency (RF) shield, according to an embodiment. An embodiment provides an RF shield enclosure 100. In the depicted embodiment, the RF shield enclosure 100 is configured to be fabricated in one piece, i.e., integrally formed, from a sheet of conductive material such as conventional sheet metal (e.g., by stamping, punching, cutting, bending, drawing, folding, or any suitable forming process or combination of processes). However, in further embodiments, the RF shield enclosure 100 may be fabricated from a plurality of sheets or pieces of conductive material.

The RF shield enclosure 100 includes a cover portion 115 and an exterior fence portion 110 projecting from edges of the cover portion 115, thus forming side walls attached to the cover portion 115. As viewed in FIG. 1, the RF shield enclosure 100 is concave, and is configured to partially enclose an interior shielded volume within the concave cavity. The RF shield enclosure 100 thus is able to create, in an embodiment, the top and sides of a Faraday cage around the interior shielded volume, while the bottom side of the Faraday cage can be created by a surface (e.g., a ground plane of a printed circuit board such as PCB 300, shown in FIG. 3), to which the RF shield enclosure 100 can be surface mounted, thus fully enclosing the interior shielded volume. In an embodiment, the surface is substantially planar. As used herein, the terms "enclosure," "enclose," and "fully enclose" are not limited to gapless, sealed, or airtight enclosures, and can encompass enclosures having a number of gaps, holes, conduits, and the like, to the extent that such gaps, holes, conduits, etc., do not prevent or materially impair the formation of an effective Faraday cage around the interior shielded volume. In a further illustrative example, while embodiments such as the depicted embodiment are fabricated from a single sheet of conductive material such as sheet metal, in further embodiments, for example, all or part of the RF shield enclosure 100 can comprise a conductive (e.g., wire) mesh or cage.

Within the exterior fence portion 110, internal shielding partitions, such as partitions 120, 130, 140, are attachable to the cover portion 115 and/or to the fence portion 110 (e.g., by pins or other fasteners, by adhesives, held by pressure, held within grooves, etc.), such that the shielding partitions 120, 130, 140 each are supported in a fixed position relative to the RF shield enclosure 100. The shielding partitions 120, 130, 140 are made of a conductive material, and are deployed within the interior shielded volume defined by the cover portion 115 and the fence portion 110 to define a plurality of chambers (e.g., cavities, compartments, or enclosures). FIG. 1 depicts three such chambers; e.g., chamber 165. Each chamber is depicted, in FIG. 1, as having an open side, through which a viewer observes the interior of the RF shield enclosure 100. When the open side is closed (e.g., by surface mounting the RF shield enclosure 100 to a surface, e.g., a printed circuit board), a chamber such as chamber 165 is able to enclose one or more conductors (e.g., an RF conductor), and thus to provide RF shielding, e.g., to isolate conductors or conductors or components within the chamber.

The exterior fence portion 110 of the RF shield enclosure 100 has an open side, and the perspective view of FIG. 1 provides a view of an interior portion of the RF shield as viewed from the open side. The cover portion 115 of the RF shield enclosure 100 is a largest side that is opposite the open side. The largest side of the RF shield enclosure 100 is the side most prominently visible in FIG. 2A, FIG. 2D, and FIG. 4. The open side, which is opposite to the cover portion 115, is the side most prominently visible in the perspective view of FIG. 1 and in FIG. 2C.

The cover portion 115 is closed or substantially closed, except for ventilation conduits or holes in the depicted embodiment. In some embodiments, one or more additional small holes may be provided in the RF shield enclosure 100, e.g., for fasteners such as may be suitable to secure interior shielding partitions 120, 130, 140 to the exterior fence portion 110.

An embodiment of the RF shield enclosure 100 has two ends: a broad end 170, and a narrow end 180 distal to the broad end. In an embodiment, the RF shield enclosure 100 is attachable to a connector 150 which protrudes or projects outward from the narrow end 180. In some embodiments, the connector 150 also protrudes or projects slightly inward (i.e., into the chamber 165) from the narrow end 180. The RF shield enclosure 100 may, for example, include a hole for receiving the connector 150, which in some embodiments is further secured to the RF shield enclosure 100 (e.g., by adhesive, a flexible membrane or gasket, etc.). The connector 150 can be, for example, a coaxial cable connector, or other male or female connector, receptacle, jack, etc.

The connector 150 is for receiving a second connector (not shown), such as a corresponding connector, jack, receptacle, or the like (e.g., of an opposite gender), and for electrically coupling an RF conductor 160 contained within the RF shield enclosure 100 to a corresponding second RF conductor (not shown) that extends outside the RF shield enclosure 100 via the connector 150, e.g., to provide RF input and/or output to a device to which the RF shield enclosure 100 is mounted. In an illustrative example, the second connector is at an end of a cable (e.g., a coaxial cable), and the second RF conductor extends from the second connector, through the length of the cable, to an opposite end of the cable.

Thus, in an embodiment, the connector 150 is configured to receive, from outside the RF shield enclosure 100, the second connector, and to electrically couple a second conductor (e.g., a second conductor that terminates at the second connector) to the conductor 160. In an illustrative example, the conductor 160 can comprise a wire configured to be electrically coupled to a central wire of a coaxial cable when the coaxial cable is removably connected to the connector 150.

In an embodiment, the conductor 160 has a connector end and an opposite end. In an illustrative example of a first embodiment, a portion of the conductor 160 at or proximate to the connector end of conductor 160 is configured to be in electrical contact with a conductive portion of the connector 150, which in turn is in electrical contact with a conductive portion of a cable connected to the connector 150. In an illustrative example of another embodiment, the conductor 160 is configured to be directly in electrical contact with a conductive portion of the cable connected to the connector 150.

The conductor 160 also is configured to be in electrical contact, at or proximate to the opposite end of conductor 160, with a corresponding conductor on a circuit side of the PCB 300. The conductor 160 is, for example, able to be electrically coupled to a corresponding connector (such as a pad, pin, waveguide, socket, receptacle, etc.) located on, or accessible through a conduit in, a portion of the ground plane of PCB 300 that encloses a side of the chamber 165. The conductor 160 is thus, in some embodiments, isolated in its entirety within chamber 165. In other embodiments, the conductor 160 is isolated within chamber 165 except for a portion of the conductor 160, distal to the connector end, that can exit the chamber 165 through the portion of the ground plane of PCB 300 that encloses a side of the chamber 165, e.g., through a conduit (e.g., a plated through via) that passes through PCB 300 to the circuit side of PCB 300.

Figure 2A:
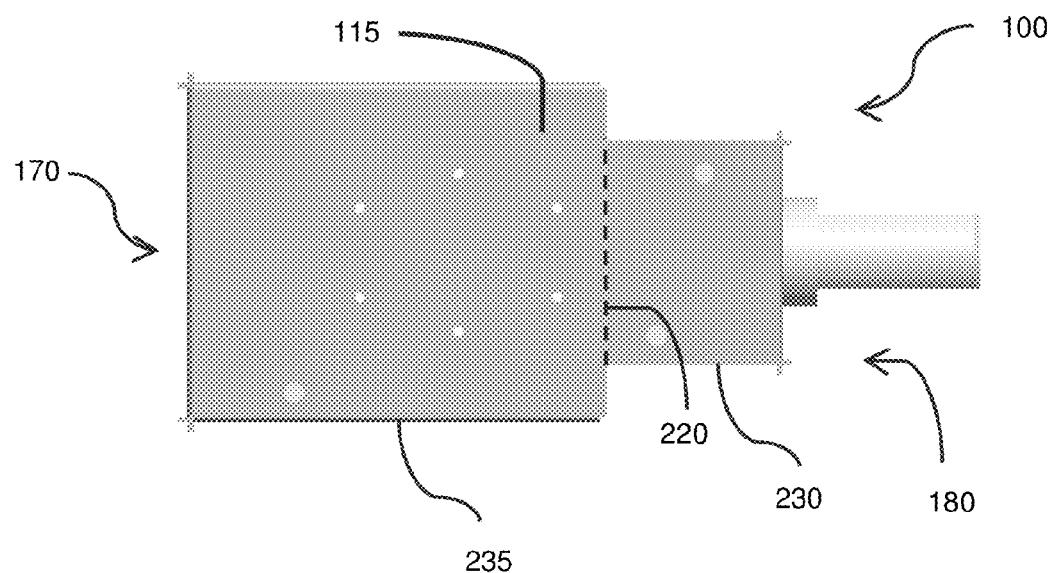
FIG. 2A depicts a top view of an RF shield, according to an embodiment.
Figure 2B:
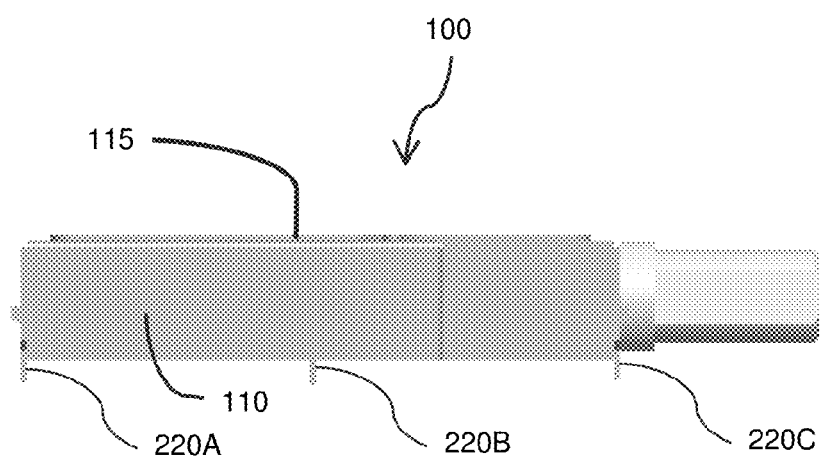
FIG. 2B depicts a side view of an RF shield, according to an embodiment.
Figure 2C:
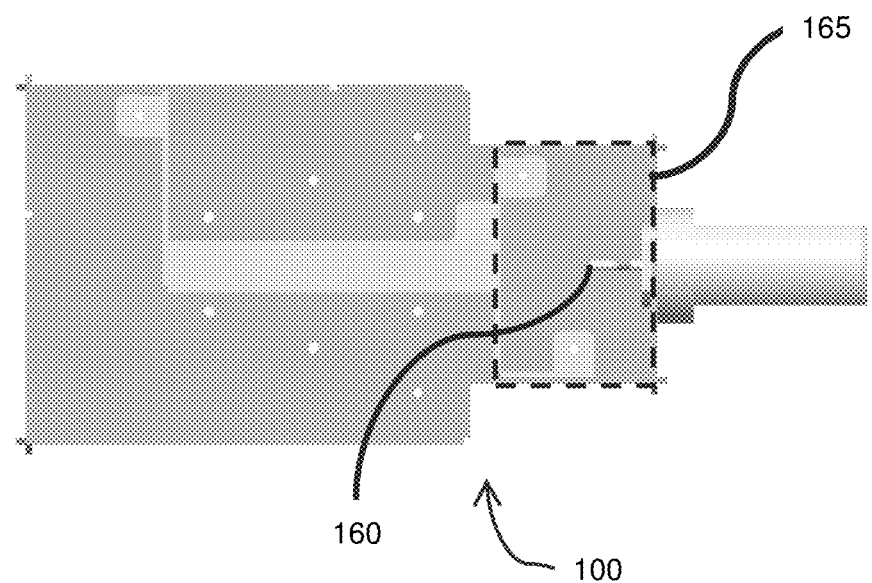
FIG. 2C depicts a bottom view of an RF shield, according to an embodiment.
Figure 2D:
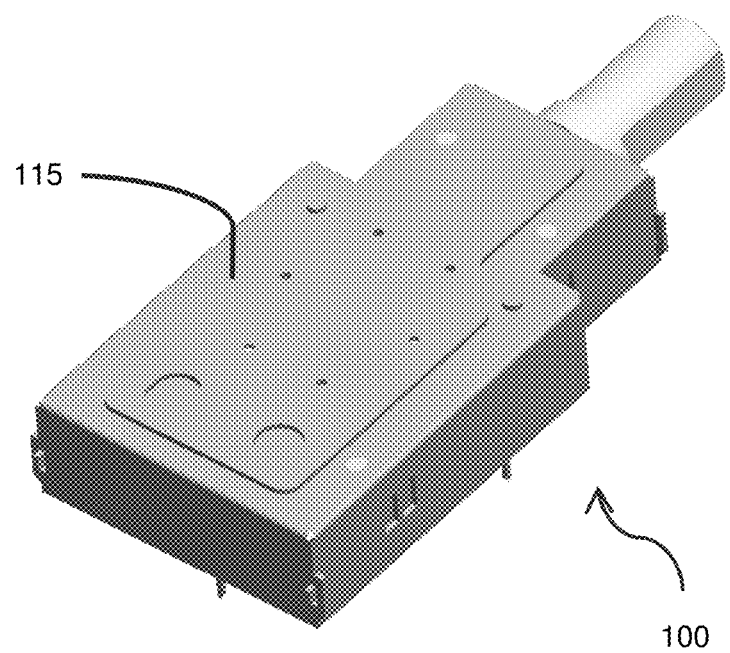
FIG. 2D depicts a perspective view of an RF shield, according to an embodiment.

FIGS. 2A-2C depict, respectively, a first, second, and third view of an RF shield enclosure 100, according to an embodiment. FIG. 2D depicts a perspective view of an RF shield, according to an embodiment. Without limiting the actual or potential physical orientations of embodiments of the RF shield, and solely for convenience, the first view of FIG. 2A may be referred to herein as a top view, the second view of FIG. 2B may be referred to herein as a side view, the third view of FIG. 2C may be referred to herein as a bottom view, and the view of FIG. 2D may be referred to herein as a top perspective view. More generally, FIG. 2A depicts the largest side, FIG. 2B depicts a side perpendicular to the largest side and to the open side, FIG. 2C depicts the open side, and FIG. 2D depicts a perspective view of the largest side.

As depicted in FIG. 2A, an embodiment of the RF shield enclosure 100 is configured to provide a broad portion 235 that includes the broad end 170, and to provide a narrow portion 230 that includes the narrow end 180. The broad portion 235 and the narrow portion 230 are depicted on opposite sides of dashed line 220, which is included merely for reference, and is not intended to indicate the location of a physical divider or partition of the RF shield enclosure 100. As shown in FIG. 2D, the broad portion 235 and the narrow portion 230 both are formed from the cover portion 115 and are not divided from each other.

With reference to FIG. 2B, surface mounting of the RF shield enclosure 100 to a printed circuit board (PCB) may be facilitated by fabricating a plurality of mounting pins (such as pins 220A, 220B, 220C) as an integral part of the exterior fence portion 110.

With reference to FIG. 2C, in an embodiment, a plurality of cavities are defined within the RF shield enclosure 100 by the fence portion 110 and by the internal shielding partitions such as shielding partitions 120, 130, 140. In particular, FIG. 2C depicts chamber 165, a shielded cavity of an RF shield enclosure 100 according to an embodiment. Chamber 165 is the cavity that encloses the conductor 160, i.e., the cavity most proximate to the connector 150 and to the narrow end 180. The chamber 165 (as depicted in FIG. 1) is bounded, distal to the narrow end 180, by a first side of internal shielding partition 130. As shown in both FIG. 2C and FIG. 1, the conductor 160 is thus isolated to its own chamber 165. That is, in an embodiment, the chamber 165 contains no other electronic component that would be susceptible to EMI from the conductor 160.

It is noted that chamber 165 is entirely within the narrow portion 230 of the RF shield enclosure 100 (see FIG. 2A). The shape of the chamber 165 is accordingly referred to as a bottleneck. Embodiments of the RF shield enclosure 100 provide a bottleneck design in which the chamber 165 is a shielded cavity that is smaller in at least one dimension (e.g., width), relative to the remainder of the RF shield enclosure 100, to minimize RF interference. In the depicted example, chamber 165 is made narrower than the remainder of the RF shield enclosure 100.

In some embodiments, chamber 165 can occupy all of the space within the narrow portion 230. However, in the illustrated embodiment, chamber 165 does not occupy all of the space within the narrow portion 230, but does occupy a substantial majority of the space within the narrow portion 230, e.g., over 80%. For example, as depicted, chamber 165 occupies approximately 85% of the space within the narrow portion 230. In an embodiment such as that depicted in FIGS. 1 and 2C, at least one additional chamber is partially within the narrow portion 230 and is mostly within the broad portion 235, and is bounded by internal shielding partition 130. FIG. 1 and FIG. 2C depict two such additional chambers in an illustrative example of an embodiment, each chamber being partially within the narrow portion 230 and also partially within the broad portion 235, and bounded by the shielding partition 130 (and more particularly, by the side of shielding partition 130 distal to the narrow end 180).

Accordingly, embodiments of the RF shield enclosure 100 provide a bottleneck design in which chamber 165 is a shielded cavity that is smaller in at least one dimension (e.g., width), relative to the remainder of the RF shield enclosure 100, to minimize RF interference. For example, as illustrated, chamber 165 is made narrower than the remainder of the RF shield enclosure 100. Thus, in an embodiment, the bottleneck configuration of the chamber 165 provides the RF shield enclosure 100 with increased RF immunity. As a result of this configuration, in an embodiment, any stray RF interference inside the chamber 165 will not significantly resonate and thereby cause interference.

Figure 3:
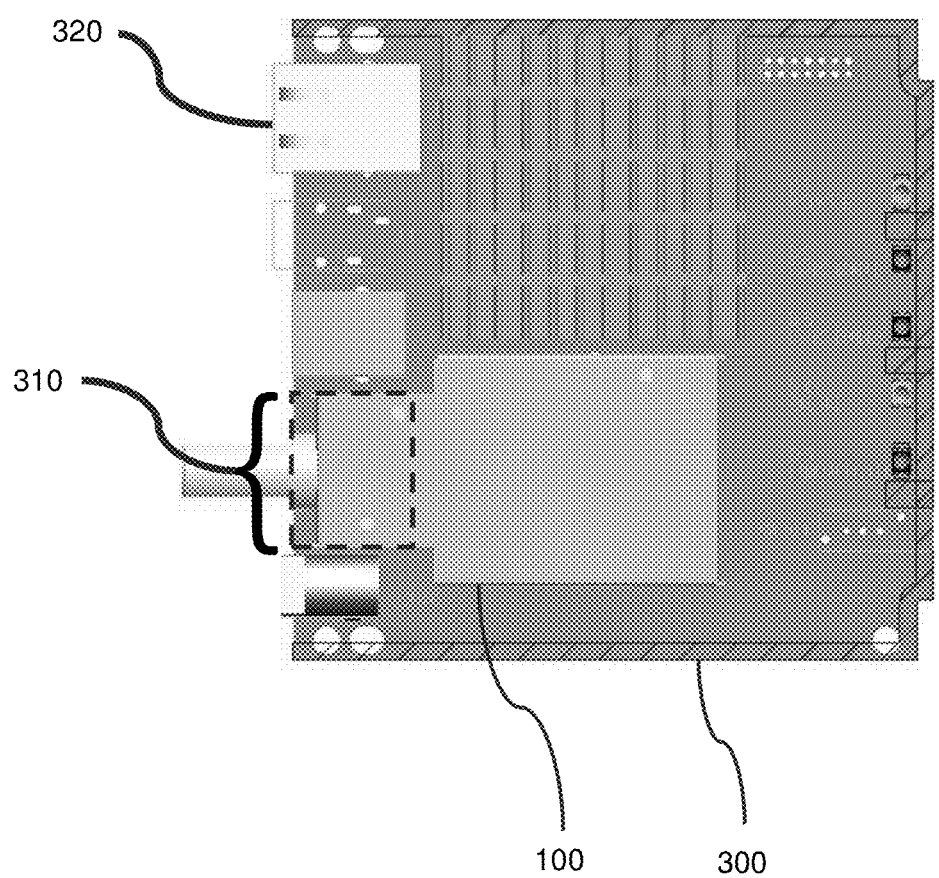
FIG. 3 depicts an RF shield according to an embodiment, physically coupled to a printed circuit board.

With reference to FIG. 3, an illustrative example is depicted in which an RF shield enclosure 100 according to an embodiment is physically coupled (e.g., surface mounted) to a printed circuit board 300. That is, in an embodiment, one or more edges of the fence portion 110 are coupled to a surface (e.g., a ground plane) of the printed circuit board 300 to enclose the open side of the RF shield enclosure 100. In an embodiment, the RF shield enclosure 100 is attachable, e.g., by integral mounting pins 220A, 220B, 220C (see FIG. 2B), to a surface of the printed circuit board 300, with the open side facing the printed circuit board 300. In some embodiments, the PCB 300 is configured with holes (e.g., plated through vias) for receiving the mounting pins 220A, 220B, 220C, or with conductive pads to which the pins 220A, 220B, 220C may be fastened and grounded. In further embodiments, the RF shield enclosure 100 can be fastened, e.g., using solder or adhesives, to the printed circuit board 300.

As depicted, illustrative embodiments of an RF shield enclosure 100 provide the chamber 165 for shielding an input/output (I/O) envelope (e.g., just behind the connector 150). The bottleneck design of chamber 165 minimizes or reduces the dimensional requirement of the RF shield enclosure 100, as indicated by a width 310, along the I/O envelope.

Embodiments that provide such a "bottleneck" design allow for improved uses and capabilities in electronic devices that include a plurality of connectors deployed in a row, e.g., along one edge of PCB 300. In the illustrative example shown in FIG. 3, the PCB 300 is coupled, along one of its edges, not only to the connector 150, but also to at least a second connector 320, depicted in FIG. 3 as a USB port. Connectors of various types, and/or indicators such as lights, can be deployed along the same edge, for the convenience of a user; however, additional connectors and/or indicators require additional space. By minimizing the dimension (e.g., width 310) in the I/O envelope, using the "bottleneck" shield design, more room is provided for deployment of a plurality of connectors and/or indicators. In addition, the product size of the RF shield enclosure 100 is thereby reduced, which can minimize or reduce costs.

Figure 4:
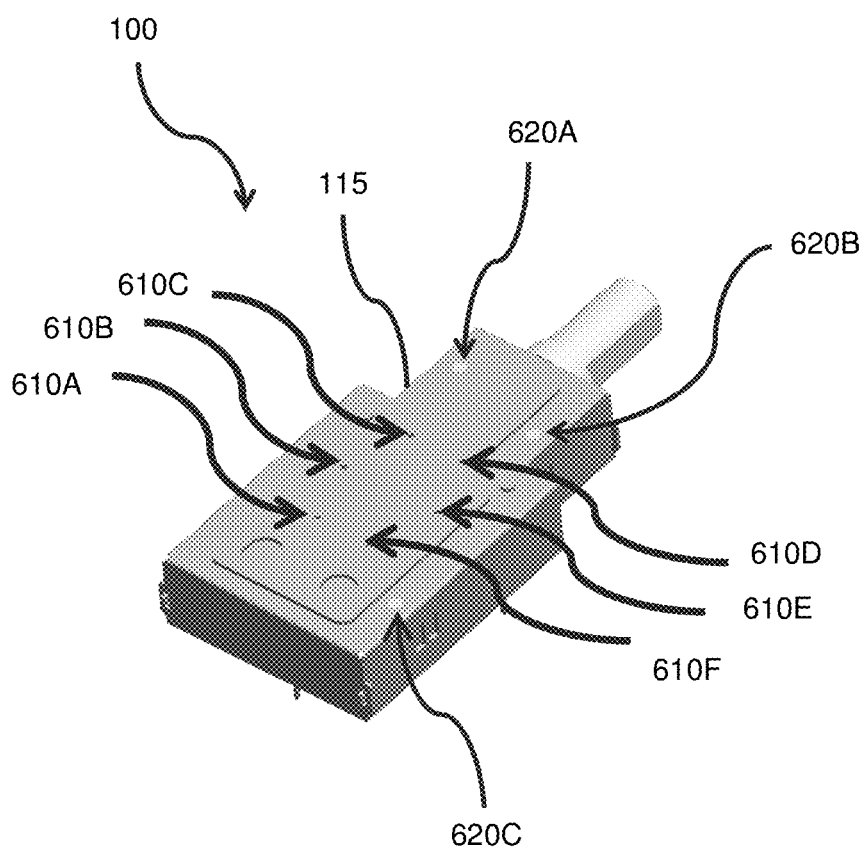
FIG. 4 depicts venting conduits of an RF shield according to an embodiment.

As shown in FIG. 4, in an embodiment, the RF shield enclosure 100 can also integrate a plurality of ventilation conduits 610A-610F (collectively referred to herein as ventilation conduits 610), e.g., holes, which allow for a uniform thermal profile inside the RF shield enclosure 100 and also allow a path for internal chemical release.

The ventilation conduits 610 are provided in the sheet of conductive material from which the RF shield enclosure 100 is fabricated (e.g., in a flat piece of sheet metal), for example, by punching holes. A plurality of ventilation conduits 610 can thus be provided to maximize air inflow while allowing for outflow of chemicals from manufacturing. In conventional high-performance RF shield enclosures, integrated venting conduits (such as ventilation conduits 610) were not included, e.g., based on previous designs in which such conduits may have prevented, or may have been thought to prevent, compliance with a performance requirement such as the 10 V/m performance requirement.

In some embodiments, one or more additional small holes such as holes 620A-620C (collectively referred to herein as holes 620) may similarly be provided in the RF shield enclosure 100. The additional holes 620 are provided not primarily for ventilation purposes, but are primarily provided for other purposes such as for fastening purposes, e.g., to secure interior shielding partitions 120, 130, 140 in place within the RF shield enclosure 100. However, like ventilation conduits 610, the additional holes 620 can similarly allow for outflow of chemicals from manufacturing.

While the principles of the invention have been described above in connection with specific devices, apparatus, systems, and/or methods, it is to be clearly understood that this description is made only by way of example and not as limitation. One of ordinary skill in the art will appreciate that various modifications and changes can be made without departing from the scope of the claims below. Accordingly, the specification and figures are to be regarded in an illustrative rather than a restrictive sense, and all such modifications are intended to be included within the scope of the present invention.

The word "comprise" or a derivative thereof, when used in a claim, is used in a nonexclusive sense that is not intended to exclude the presence of other elements or steps in a claimed structure or method. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A radio frequency shield, comprising: a shield enclosure formed of conductive material, defining and partially enclosing an interior cavity by providing a cover portion and a fence portion that projects from edges of the cover portion, wherein the shield enclosure defines and partially encloses the interior cavity and does not enclose an open side of the interior cavity, the fence portion being mountable, at an edge distal to the cover portion, to a substantially planar surface to enclose the open side of the interior cavity; the shield enclosure having a three-dimensional shape comprising a broad portion and a narrow portion, the broad portion including a broad end of the shield enclosure formed from the fence portion, and the narrow portion comprising a narrow end of the shield enclosure formed from the fence portion, wherein: the narrow end is distal to the broad end and comprises a coupling for coupling the narrow end to a connector, the broad portion comprises the broad end, a broad portion of the cover portion, and a first pair of side walls formed from the fence portion, and the narrow portion comprises the narrow end, a narrow portion of the cover portion that is narrower than the broad portion, and a second pair of side walls formed from the fence portion; and the shield enclosure further comprising a receiving portion for receiving, within the interior cavity, a shielding partition that is securable in a fixed relative to the shield enclosure, wherein the fixed position of the shielding partition defines a first end of a first chamber within the narrow portion; wherein the first chamber within the narrow provides radio frequency isolation of a first radio frequency conductor, and isolates the first radio frequency conductor from the broad portion, when the first radio frequency conductor is electrically coupled to the connector and enclosed within the first chamber and the shield enclosure is grounded and the fence portion is mounted to the substantially planar surface; wherein the substantially planar surface comprises a ground plane of a printed circuit board: wherein the printed circuit board comprises a circuit side opposite the around plane: and wherein the first conductor is contained within the first chamber except for an end portion of the conductor distal to the connector, the end portion of the conductor extending outside the chamber through a conduit in the printed circuit board for electrical communication.

2. The radio frequency shield of claim 1, wherein:
the first chamber is a substantially rectangular portion of the interior cavity bounded by the narrow end distal to the first end, and bounded on a plurality of sides by the narrow portion.

3. The radio frequency shield of claim 1, wherein the fence portion is mountable to the substantially planar surface with the interior cavity facing the substantially planar surface, such that the interior cavity is substantially fully enclosed by the substantially planar surface on a first side, by the cover portion on a second side distal to the first side, and by the fence portion around edges of the first side and the second side.

4. The radio frequency shield of claim 1, wherein the substantially planar surface is substantially parallel to the cover portion.

5. The radio frequency shield of claim 1, wherein:
the broad portion partially encloses a three-dimensional substantially rectangular first volume of the interior cavity; and
the narrow portion partially encloses a three-dimensional substantially rectangular second volume of the interior cavity that is smaller than the first volume.

6. The radio frequency shield of claim 5, wherein:
the broad portion defines at least four adjacent sides of the first volume; and
the narrow portion defines at least four adjacent sides of the second volume.

7. The radio frequency shield of claim 5, wherein:
the first volume and the second volume together comprise the interior cavity, and the shield enclosure does not physically separate the first volume and the second volume from one another.

8. The radio frequency shield of claim 1, wherein the shield enclosure is formed from a single piece of conductive material.

9. The radio frequency shield of claim 1, wherein the fence portion is substantially perpendicular to the cover portion, and the at least one shielding partition has at least one side substantially perpendicular to the cover portion.

10. The radio frequency shield of claim 1, wherein the fixed position places at least an edge of the shielding partition in electrical contact with at least one of the cover portion and the fence portion.

11. The radio frequency shield of claim 1, wherein the first radio frequency conductor is electrically coupled to the connector, and wherein the connector comprises a receiving portion for receiving a second radio frequency conductor that extends outside the shield enclosure, for electrically coupling the first radio frequency conductor thereto via the connector.

12. The radio frequency shield of claim 1, wherein a plurality of ventilation conduits are provided in the cover portion.

13. The radio frequency shield of claim 1, wherein the radio frequency shield further comprises the connector.

14. The radio frequency shield of claim 1, wherein the radio frequency shield further comprises the shielding partition.

15. The radio frequency shield of claim 14, further comprising one or more additional shielding partitions, each securable in an additional fixed position relative to the shield enclosure, wherein the one or more additional shielding partitions define one or more additional chambers within the shield enclosure.

16. A system comprising:
a printed circuit board having a substantially planar surface and one or more connectors mounted to the substantially planar surface along an edge of the substantially planar surface;
a radio frequency shield enclosure mounted to the substantially planar surface along the edge of the substantially planar surface,
the shield enclosure formed of conductive material to define and partially enclose an interior cavity by providing a cover portion and a fence portion that projects from edges of the cover portion, the fence portion being mounted to the substantially planar surface at an edge distal to the cover portion, thereby enclosing the interior cavity, and
the shield enclosure having a three-dimensional shape comprising a broad portion and a narrow portion, the broad portion including a broad end of the shield enclosure formed from the fence portion, and the narrow portion comprising a narrow end of the shield enclosure formed from the fence portion, wherein:
the narrow end is distal to the broad end and comprises a receiving portion for receiving a first connector of the one or more connectors,
the broad portion comprises the broad end, a broad portion of the cover portion, and a first pair of side walls formed from the fence portion, and
the narrow portion comprises the narrow end, a narrow portion of the cover portion that is narrower than the broad portion, and a second pair of side walls formed from the fence portion;
a shielding partition that is secured within the interior cavity, in a fixed position relative to the shield enclosure, wherein the fixed position of the shielding partition defines a first end of a first chamber within the narrow portion; and
a first conductor mounted to the substantially planar surface within the first chamber, wherein the first chamber within the narrow portion provides radio frequency isolation of the first conductor, and isolates the first radio frequency conductor from the broad portion, when the first conductor is electrically coupled to the connector and enclosed within the first chamber and the shield enclosure is grounded and the fence portion is mounted to the substantially planar surface;

wherein:
the substantially planar surface comprises a ground plane of the printed circuit board;
the printed circuit board comprises a circuit side opposite the ground plane; and
the first conductor is contained within the first chamber except for an end portion of the conductor distal to the connector, the end portion of the conductor extending outside the chamber through a conduit in the printed circuit board for electrical communication.

17. The system of claim 16, wherein:
the broad portion partially encloses a three-dimensional substantially rectangular first volume of the interior cavity; and
the narrow portion partially encloses a three-dimensional substantially rectangular second volume of the interior cavity that is smaller than the first volume.

\* \* \* \* \*